(12) United States Patent
Noro et al.

(10) Patent No.: US 6,221,510 B1
(45) Date of Patent: Apr. 24, 2001

(54) EPOXY RESIN COMPOSITION FOR ENCAPSULATING PHOTOSEMICONDUCTOR ELEMENT AND PHOTOSEMICONDUCTOR DEVICE

(75) Inventors: Masato Noro; Nariya Komada; Katsumi Shimada; Satoshi Okuda; Shinjiro Uenishi; Kuniharu Hattori, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/295,443

(22) Filed: Apr. 21, 1999

(30) Foreign Application Priority Data

Apr. 23, 1998 (JP) .................................................. 10-112589

(51) Int. Cl.⁷ .................................................. H01L 29/12
(52) U.S. Cl. ............................................. 428/620; 523/456
(58) Field of Search ............................... 428/620; 523/456

(56) References Cited

U.S. PATENT DOCUMENTS 6,001,483 * 12/1999 Harada et al. ........................ 428/413

FOREIGN PATENT DOCUMENTS

02253645 * 10/1990 (JP) .
03094454 * 4/1991 (JP) .
03201470 * 9/1991 (JP) .

* cited by examiner

Primary Examiner—Robert Dawson
Assistant Examiner—D. Aylward
(74) Attorney, Agent, or Firm—Sughrue, Mion, Zinn, Macpeak & Seas, PLLC

(57) ABSTRACT

An epoxy resin composition for encapsulating a photosemiconductor element excellent in releasing property from a mold in forming and in adhesion to the photosemi conductor element is provided. The epoxy resin composition comprises element comprising the following components (A) to (D):

(A) an epoxy resin;
(B) a hardener;
(C) a silane coupling agent having an epoxy group, a mercapto group or an amino group; and
(D) a releasing agent in which a molecule thereof has structure moieties represented by the following general formulas (1) and (2) and in which the weight ratio of the structure moiety represented by general formula (2) is 25% to 95% by weight based on the whole molecule,

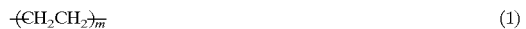 (1)

wherein m is a positive integer of 8 to 100 and

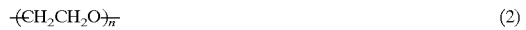 (2)

wherein n is a positive integer.

8 Claims, 1 Drawing Sheet

FIGURE
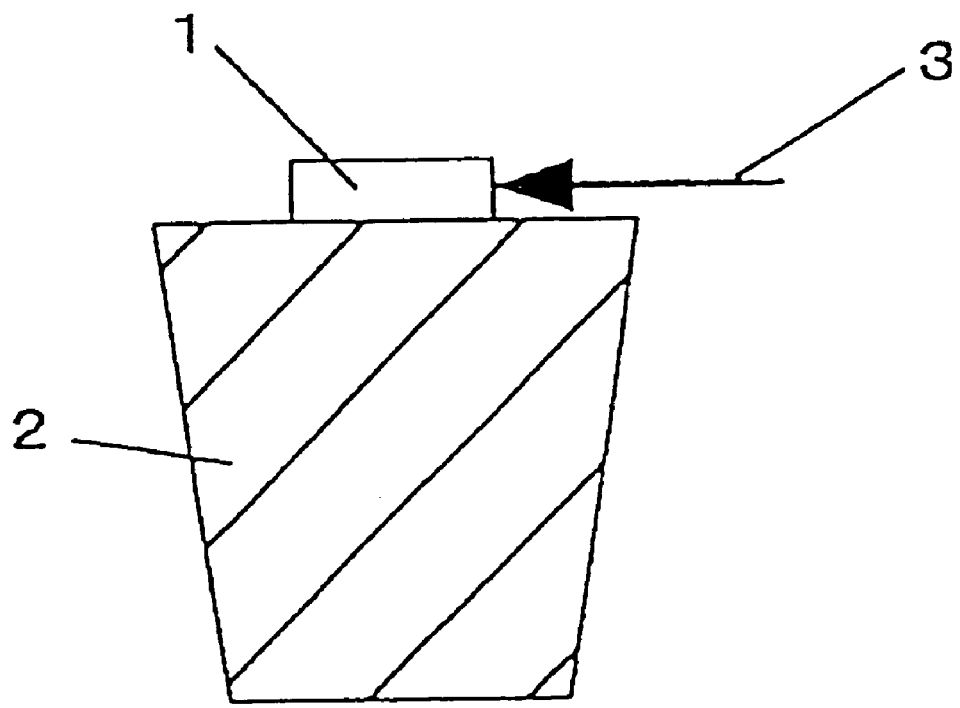

EPOXY RESIN COMPOSITION FOR ENCAPSULATING PHOTOSEMICONDUCTOR ELEMENT AND PHOTOSEMICONDUCTOR DEVICE

FIELD OF THE INVENTION

The present invention relates to an epoxy resin composition for encapsulating a photosemiconductor element (hereinafter briefly referred to as an "epoxy resin composition") and a photosemiconductor device using the same.

BACKGROUND OF THE INVENTION

Previously, epoxy resin compositions have been used as encapsulating materials for photosemiconductors such as light receiving elements and light emitting elements from the view point that the encapsulating materials should be excellent in transparency, moisture resistance and heat resistance.

However, conventional epoxy resin compositions are excellent in transparency, but have the problem that when the epoxy resin compositions are formed, for example, transfer molded, in forming molds in which photosemiconductor elements are arranged to encapsulate the photosemiconductor elements with the resins, thereby producing photosemiconductor devices, the mold releasing property is extremely deteriorated in taking the photosemiconductor devices out of the forming molds. Accordingly, various problems arise such as deformation of the photosemiconductor devices due to stress on mold releasing, generation of cracks in packages, separation of the photosemiconductor elements from the encapsulating resins, and separation of gold wires.

In general, when epoxy resin compositions are transfer molded, releasing agents are added to the epoxy resin compositions for improving the mold releasing property of moldings. When the photosemiconductor elements are encapsulated with the epoxy resin compositions by transfer molding as described above, addition of releasing agents for improving the mold releasing property without deteriorating the transparency of the epoxy resin compositions has been proposed (JP-A-6-157817 (the term "JP-A" as used herein means an "unexamined published Japanese patent application"), WO096/15191).

It is considered that the mold releasing property appears due to the presence of the releasing agent on the interface between the epoxy resin composition and mold in forming. When the photosemiconductor element is encapsulated with the epoxy resin composition by forming, for example, transfer molding, it is considered that the releasing agent is also present on the interface between the epoxy resin composition and photosemiconductor element. In that case, the releasing agent may cause separation of the photosemiconductor element from the epoxy resin composition at the interface between them in a formed photosemiconductor device, sometimes resulting in impairment of the function of the photosemiconductor device.

SUMMARY OF THE INVENTION

It is therefore an object of the present invention to provide an epoxy resin composition excellent in releasing property from a mold in forming, for example, in transfer molding, excellent in adhesion to a photosemiconductor element, and good in transparency.

For attaining the above-mentioned object, the present invention provides an epoxy resin composition comprising the following components (A) to (D):

(A) an epoxy resin;
(B) a hardener;
(C) a silane coupling agent having an epoxy group, a mercapto group or an amino group; and
(D) a releasing agent in which a molecule thereof has structure moieties represented by the following general formulas (1) and (2), and in which the weight ratio of the structure moiety represented by general formula (2) is 25% to 95% by weight based on the whole molecule.

 (1)

wherein m is a positive integer of 8 to 100.

 (2)

wherein n is a positive integer.

The above-mentioned silane coupling agent having an epoxy group, a mercapto group or an amino group, component (C), is preferably a compound represented by the following general formula (3):

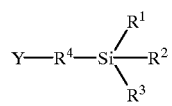 (3)

wherein Y is a monofunctional organic group having an epoxy group, a mercapto group or an amino group; $R^1$ to $R^3$ each independently represents a methoxy group, an ethoxy group, a methyl group or an ethyl group, with the proviso that at least one of $R^1$ to $R^3$ is a methoxy group or an ethoxy group; and $R^4$ is an alkylene group having 2 to 5 carbon atoms.

The above-mentioned epoxy resin, component (A), preferably include a resin represented by the following general formula (4):

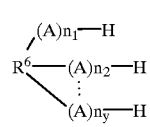 (4)

wherein $R^6$ is an organic compound residue having y active hydrogen atoms; $n_1, n_2 \ldots n_y$ each represents an integer of 0 or 1 to 100, and the sum thereof is 1 to 100; y is an integer of 1 to 100; and A is the following cyclohexane skeleton having a substituent group Z:

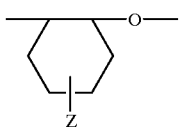

wherein Z is

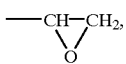

—CH=CH$_2$ or —CH(OH)—CH$_2$—OR$^7$, wherein $R^7$ is a hydrogen atom, an alkyl group, a carboalkyl group or a carboaryl group, with the proviso that at least one of Z is

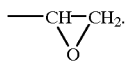

Further, the photosemiconductor device of the present invention is characterized in that a photosemiconductor element is encapsulated with the above-mentioned epoxy resin composition.

BRIEF DESCRIPTION OF THE DRAWING

Figure is a cross sectional view showing a shape of a sample for measuring the adhesion of a photosemiconductor element with a hardened article of an epoxy resin composition.

DETAILED DESCRIPTION OF THE INVENTION

Embodiments of the present invention will be described below in detail.

The epoxy resin composition of the present invention comprises the following components (A) t (D), and is usually in the form of liquid, powder or tablets obtained by tableting the powder:

(A) an epoxy resin;
(B) a hardener;
(C) a silane coupling agent having an epoxy group, a mercapto group or an amino group; and
(D) a releasing agent in which a molecule thereof has structure moieties represented by the following general formulas (1) and (2), and in which the weight ratio of the structure moiety represented by general formula (2) is 25% to 95% by weight based on the whole molecule.

  (1)

wherein m is a positive integer of 8 to 100.

  (2)

wherein n is a positive integer.

In the present invention, the epoxy resins, component (A), include, for example, bisphenol A type epoxy resins, bisphenol F type epoxy resins, phenol novolak type epoxy resins, cresol novolak type epoxy resins, alicyclic epoxy resins, nitrogen ring-containing epoxy resins such as triglycidyl isocyanurate and hydantoin epoxy resins, hydrogenated bisphenol A type epoxy resins, aliphatic epoxy resins, glycidyl ether type epoxy resins, bisphenol S type epoxy resins, biphenyl epoxy resins, which is a main current as a low water-absorptive hardened material type resin, dicyclo type epoxy resins and naphthalene type epoxy resins. They may be used either alone or in combination. Of the above-mentioned various epoxy resins, bisphenol A type epoxy resins, aliphatic epoxy resins and triglycidyl isocyanurate are preferably used from the viewpoint that hardened articles of epoxy resin compositions do not discolor after encapsulating of the photosemiconductor elements. Epoxy resins represented by the following general formula (4) are particularly preferred among others.

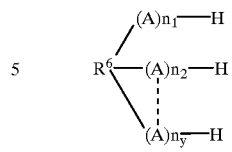  (4)

wherein $R^6$ is an organic compound residue having y active hydrogen atoms; $n_1, n_2 \ldots n_y$ each represents an integer of 0 or 1 to 100, and the sum thereof is 1 to 100; y is an integer of 1 to 100; and A is the following cyclohexane skeleton having a substituent group Z:

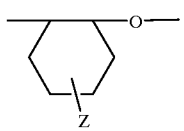

wherein Z is

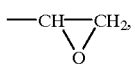

—CH=CH$_2$ or —CH(OH)—CH$_2$—OR$^7$, wherein R$^7$ is any one of hydrogen, an alkyl group, a carboalkyl group and a carboaryl group, and the epoxy resin of formula (4) contains at least one

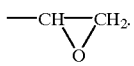

The above-mentioned epoxy resins can be used either alone or as a combination of two or more of them. In particular, when the epoxy resins represented by the above-mentioned general formula (4) are used, the amount thereof used is preferably from 10% to 100% by weight based on the whole epoxy resin (component (A)). In the present invention, the use of the epoxy resins represented by the above-mentioned general formula (4) gives the effect of preventing the generation of leakage current in the photosemiconductor devices under the conditions of high temperature and humidity, as shown in examples given later.

As the epoxy resins as described above, ones having an epoxy equivalent of 100 to 1000 and a softening point of 120° C. or less are generally used.

In the present invention, it is particularly preferred to use an acid anhydride hardener as the hardener, component (B), from the viewpoint that the hardened articles of the epoxy resin compositions are difficult to discolor.

As the acid anhydride hardener, those having a molecular weight of about 140 to about 200 are preferably used. Examples thereof include colorless or pale yellow acid anhydrides such as phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride and methyltetrahydrophthalic anhydride. They may be used either alone or as a combination of two or more of them. Of the above-mentioned acid anhydride hardeners, phthalic anhydride, hexahydrophthalic anhydride, tetrahydrophthalic anhydride and methylhexahydrophthalic anhydride are preferably used.

Further, besides the above-mentioned acid anhydride hardeners, amine hardeners, phenol hardeners, hardeners obtained by esterifying the above-mentioned acid anhydride hardeners with glycols, or hardeners of carboxylic acids such as hexahydrophthalic acid, tetrahydrophthalic acid and methylhexahydrophthalic acid can be used either alone or in combination.

With respect to the compounding ratio of the above-mentioned epoxy resin (component (A)) and the hardener (compound (B)), when the acid anhydride hardener is used as the hardener, the compounding ratio is preferably adjusted such that the amount of acid anhydride is from 0.5 to 1.5 equivalents, particularly preferably from 0.7 to 1.2 equivalents per one equivalent of epoxy group in the epoxy resin. If the amount of acid anhydride is less than 0.5 equivalent, the deteriorated hue of the resulting hardened epoxy resin composition tends to be caused. On the other hand, if it exceeds 1.5 equivalents, there is a tendency of lowering the moisture resistance.

Further, when the resin represented by the above-mentioned general formula (4) is used as the epoxy resin (component (A)), the ratio is preferably set such that the amount of acid anhydride is from 0.5 to 1.0 equivalent, more preferably from 0.6 to 0.85 equivalent, for preventing the generation of leakage current in the photosemiconductor device under the conditions of high temperature and humidity.

Also when the other hardeners than the acid anhydride hardeners, i.e., the above-mentioned amine hardeners, phenol hardeners, hexahydrophthalic acid, carboxylic acids, and the like are used as the hardener (component (B)) singly or in combination, the compounding ratio thereof can be set similarly to the compounding ratio (equivalent ratio) described in the case where the acid anhydride is used.

In the present invention, the silane coupling agent having an epoxy group, a mercapto group or an amino group, component (C), includes, for example, a compound represented by the following general formula (3):

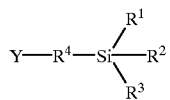
(3)

wherein Y is a monofunctional organic group having an epoxy group, a mercapto group or an amino group; $R^1$ to $R^3$ each independently represents a methoxy group, an ethoxy group, a methyl group or an ethyl group; with the provido that at least one of $R_1$ to $R^3$ is a methoxy group or an ethoxy group; and $R^4$ is an alkylene group having 2 to 5 carbon atoms.

As to the specified silane coupling agents, component (C), more specifically, the epoxy group-containing coupling agents include γ-glycidoxypropyltrimethoxysilane, γ-glycidoxypropyltriethoxysilane, γ-glycidoxypropylmethyl-dimethoxysilane, γ-glycidoxypropylmethyldiethoxysilane, β-3,4-epoxycyclohexyl)ethyltrimethoxysilane and β-(3,4-epoxycyclohexyl)ethyltriethoxysilane, the mercapto group-containing coupling agents include γ-mercaptopropyl-trimethoxysilane and γ-mercaptopropyltriethoxysilane, and the amino group-containing coupling agents include N-β (aminoethyl)γ-aminopropyltrimethoxysilane, N-β (aminoethyl) γ-aminopropyltriethoxysilane, N-β (aminoethyl) γ-aminopropyl-methyldimethoxysilane, N-β (aminoethyl) γ-aminopropylmethyl-diethoxysilane, γ-aminopropyltrimethoxysilane and γ-aminopropyltriethoxysilane.

It is desirable to adjust the content of the specified silane coupling agent, component (C), to 0.001% to 10% by weight, preferably 0.05% to 4% by weight, and more preferably 0.2% to 2% by weight, based on the whole amount of the epoxy resin composition of the present invention.

In the present invention, the specified releasing agent, component (D), is a releasing agent having structure moieties represented by the following general formulas (1) and (2) in a molecule thereof.

m in general formula (1) is an integer of 8 to 100, and the weight ratio of the structure moiety represented by general formula (2) is set within the range of 25% to 95% by weight based on the whole molecule. Preferably, m in general formula (1) is a positive integer of 13 to 60, and the weight ratio of the structure moiety represented by general formula (2) is set within the range of 35% to 85% by weight based on the whole molecule. More preferably, m in general formula (1) is an integer of 17 to 40, and the weight ratio of the structure moiety represented by general formula (2) is set within the range of 40% to 70% by weight based on the whole molecule.

Further, the structure moieties represented by general formulas (1) and (2) may be present either continuously or discontinuously in the molecule. Furthermore, for each of the structure moieties represented by general formulas (1) and (2), not only one, but also a plurality of moieties may be present.

(1)

wherein m is a positive integer of 8 to 100.

(2)

wherein n is a positive integer.

Besides the structure moieties represented by the above-mentioned general formulas (1) and (2), units forming the above-mentioned releasing agents, component (D), include alkyl, alkylene and carboxyl groups, ester and ketone bonds, a benzene ring, a hydrogen atom, and a metal atom.

However, the structure moieties represented by the above-mentioned general formulas (1) and (2) usually account for 70% to 99% by weight of the above-mentioned releasing agent.

Further, the number average molecular weight of the releasing agents, component (D), is usually from 300 to 12000, preferably from 600 to 5000, and more preferably from 900 to 2500. The above-mentioned number average molecular weight is measured by gel permeation chromatography (GPC) and determined in terms of polystyrene.

In the present invention, the content of the releasing agents, component (D), is set to 0.05% to 15% by weight, preferably to 0.2% to 10% by weight, and more preferably to 0.5% to 5% by weight, based on the whole epoxy resin composition of the present invention, thereby preventing the glass transition temperature or the reliability of the moisture resistance from being reduced to result in acquisition of sufficient mold releasing property.

The epoxy resin composition of the present invention can contain hardening accelerators if necessary. The hardening accelerators include, for example, tertiary amines, imidazole compounds, quaternary ammonium salts, organic metal salts and phosphorus compounds. They may be used either alone or as a combination of two or more of them. Of the above-mentioned hardening accelerators, tertiary amines and imidazole compounds are preferably used.

The content of the above-mentioned hardening accelerators is set preferably within the range of 0.05% to 7.0% by weight, more preferably to 0.2% to 3.0% by weight, based on the above-mentioned epoxy resin (component (A)). That is to say, if the amount of the hardening accelerators compounded is less than 0.05% by weight, a sufficient hardening accelerating effect is not obtained. On the other hand, exceeding 7.0% by weight may cause discoloration of the hardened article of the epoxy resin composition.

In addition to the above-mentioned components (A) to (D) and hardening accelerators, various additives known in the art such as conventional deterioration inhibitors, modifiers, dyes and pigments can be further appropriately incorporated into the epoxy resin compositions of the present invention as so desired, as long as the transparency of the hardened article of the epoxy resin composition is not impaired.

The above-mentioned deterioration inhibitors include compounds known in the art such as phenol compounds, amine compounds, organic sulfur compounds and phosphine compounds.

The above-mentioned modifiers include glycols, silicones and alcohols which are known in the art.

When the light dispersibility is required, a filler may be further incorporated, in addition to the above-mentioned components. Examples of the filler include inorganic fillers such as quartz glass powder, talc, silica powder, alumina powder and calcium carbonate.

The epoxy resin composition of the present invention can be produced, for example, in the following manner. That is to say, the above-mentioned components (A) to (D), and the hardening accelerator, deterioration inhibitor, modifier, dye and/or pigment as so desired, are compounded at a specified ratio. Then, they are mixed and kneaded by appropriately employing dry blend methods or melt blend methods in accordance with conventional methods. Subsequently, the resulting compounded product is cooled and ground, and further tableted if necessary, to produce the epoxy resin composition.

There is no particular limitation on the encapsulating of the photosemiconductor elements by using the epoxy resin composition of the present invention. For example, the photosemiconductor element can be encapsulated with the epoxy resin composition by known molding methods such as transfer molding.

In the hardened article of the epoxy resin composition of the present invention, the light transmittance measured with a spectrophotometer at a thickness of 1 mm is preferably 70% or more, and particularly preferably 80% or more, at a wavelength of 600 nm. However, when the filler, dye or pigment is used, the light transmittance does not apply to the case.

Examples will be described below, together with comparative examples.

EXAMPLES 1 TO 11 AND COMPARATIVE EXAMPLES 1 TO 3

Respective components shown in Tables 1 to 3 were compounded at ratios shown in Tables 1 to 3, melted and kneaded (80° C. to 130° C.) with a mixing roll, and aged, followed by cooling at room temperature and grinding, thereby obtaining desired powdery epoxy resin compositions.

Using each of the powdery epoxy resin compositions thus obtained, a photosemiconductor-element was encapsulated by transfer molding (molding conditions: 150° C.×4 minutes) (package size: 19.8 mm in length×13.9 mm in width×2.8 mm in thickness), and post-cure was further conducted under the conditions of 150° C. ×3 hours, thereby producing a photosemiconductor device. As to the photosemiconductor device thus obtained, the mold releasing property thereof from a mold for transfer molding was evaluated. The mold releasing property was evaluated for the photosemiconductor device obtained at the fourth shot in continuous transfer molding after cleaning molding with a melamine resin (Nikaretto ECR Grade AA manufactured by Nippon Carbide Industries Co., Inc.). When the photosemiconductor device could be taken out of the mold (cavity) only by the operation of an injector pin, the mold releasing property was evaluated as "A". When the photosemiconductor device could be taken out of the mold by the operation of the injector pin and air blowing, the mold releasing property was evaluated as "B". When the photosemiconductor device could not be taken out of the mold by the operation of the injector pin and air blowing and was taken out of the mold by the application of mechanical force to cause the deformation of the package and the development of cracks therein, the mold releasing property was evaluated as "C". Results thereof are shown in Tables 4 to 6.

Using each of the above-mentioned epoxy resin compositions, transfer molding was performed (molding conditions: 150° C.×4 minutes), and post-cure was further conducted under the conditions of 150° C.×3 hours, thereby preparing a sample for measuring the adhesion of the photosemiconductor element as shown in Figure. In this sample, shear stress 3 was applied to the photosemiconductor element 1 to measure the shear adhesion of the photosemiconductor element with a hardened article of the epoxy resin composition 2 as shown in Figure. The measurement was made 6 times for each sample, and the mean value thereof was taken as a measured value. Results thereof are shown in Tables 4 to 6.

Further, using each of the above-mentioned epoxy resin compositions, a photosemiconductor element (element size: 2.5 mm square×0.4 mm in thickness) was encapsulated by transfer molding (molding conditions: 150° C.×4 minutes) (package size: 5 mm in length×4 mm in width×2.8 mm in thickness) to produce a photosemiconductor device. For 50 photosemiconductor devices thus obtained, the presence or absence of separation in the interfaces of the elements and the resins was visually observed under a microscope, and the number of the photosemiconductor devices in which the separation was developed was counted. Results thereof are shown in Tables 4 to 6.

Furthermore, using each of the above-mentioned epoxy resin compositions, a photosemiconductor element (chip size: 1.5 mm square×0.4 mm in thickness) was encapsulated by transfer molding (molding conditions: 150° C.×4 minutes) (package size: 4.5 mm in length×6.0 mm in width× 2.8 mm in thickness), and post-cure was further conducted under the conditions of 120° C.×6 hours, thereby obtaining a photosemiconductor device. For the photosemiconductor device thus obtained, fluctuations in leakage current were measured by the pressure cooker test (PCT) (conditions: 121° C.×2 atm.) to count the number of faults generated. Results thereof are shown in Tables 4 to 6. The method of PCT is shown below.

Method of PCT

The photosemiconductor devices (12 devices) produced using each of the above-mentioned epoxy resin compositions were placed under the PCT conditions for 20, 40, 60 and 90 hours, and then, allowed to stand at ordinary temperature and pressure for 2 hours. A voltage of 10 V was applied thereto for 30 seconds, and a leakage current value at that time was measured. The photosemiconductor device in which the leakage current value fluctuated one figure or more too much was counted as a defective product.

Further, using each of the above-mentioned epoxy resin compositions, transfer molding was performed (molding conditions: 150° C.×4 minutes), and post-cure was further conducted under the conditions of 150° C.×3 hours, thereby preparing a sample for measuring the light transmittance (a hardened article having a thickness of 1 mm). This sample was immersed in liquid paraffin in a quartz cell to inhibit light scattering on a surface of the sample, and the light transmittance at a wavelength of 600 nm was measured by use of a spectrophotometer. Results thereof are shown in Tables 4 to 6.

TABLE 1

| (Unit: part by weight) | Example | | | | | |
|---|---|---|---|---|---|---|
| | 1 | 2 | 3 | 4 | 5 | 6 |
| Epoxy Resin A | 70 | 70 | 70 | 70 | 70 | 70 |
| Epoxy Resin B | 30 | 30 | 30 | 30 | 30 | 30 |
| Epoxy Resin C | — | — | — | — | — | — |
| Epoxy Resin D | — | — | — | — | — | — |
| Hardener A | 58 | 58 | 58 | 58 | 58 | 58 |
| Hardener B | — | — | — | — | — | — |
| Hardening Accelerator A | 0.3 | 0.3 | 0.3 | 0.3 | 0.3 | 0.3 |
| Hardening Accelerator B | — | — | — | — | — | — |
| Releasing agent A | 2.0 | 2.0 | 2.0 | 2.0 | 2.0 | 2.0 |
| Releasing agent B | — | — | — | — | — | — |
| Silane Coupling Agent A | 1.0 | — | — | — | 0.05 | 5.0 |
| Silane Coupling Agent B | — | 1.0 | — | — | — | — |
| Silane Coupling Agent C | — | — | 1.0 | — | — | — |
| Silane Coupling Agent D | — | — | — | 1.0 | — | — |
| Silane Coupling Agent E | — | — | — | — | — | — |

TABLE 2

| (Unit: part by weight) | Example | | | | |
|---|---|---|---|---|---|
| | 7 | 8 | 9 | 10 | 11 |
| Epoxy Resin A | 70 | — | — | — | — |
| Epoxy Resin B | 30 | — | — | — | — |
| Epoxy Resin C | — | 100 | — | 50 | 80 |
| Epoxy Resin D | — | — | 100 | 50 | 20 |
| Hardener A | 58 | — | — | — | — |
| Hardener B | — | 23 | 65.7 | 42.2 | 28.1 |
| Hardening Accelerator A | 0.3 | — | — | — | — |
| Hardening Accelerator B | — | 0.8 | 0.8 | 0.8 | 0.8 |
| Releasing agent A | — | 2.0 | — | — | — |
| Releasing agent B | 2.0 | — | 2.0 | 2.0 | 2.0 |
| Silane Coupling Agent A | 1.0 | — | — | — | — |
| Silane Coupling Agent B | — | — | — | — | — |
| Silane Coupling Agent C | — | 1.0 | 1.0 | 1.0 | 1.0 |
| Silane Coupling Agent D | — | — | — | — | — |
| Silane Coupling Agent E | — | — | — | — | — |

TABLE 3

| (Unit: part by weight) | Comparative Example | | | |
|---|---|---|---|---|
| | 1 | 2 | 3 | 4 |
| Epoxy Resin A | 70 | 70 | — | — |
| Epoxy Resin B | 30 | 30 | — | — |
| Epoxy Resin C | — | — | 100 | 50 |
| Epoxy Resin D | — | — | — | 50 |
| Hardener A | 58 | 58 | — | — |
| Hardener B | — | — | 23 | 42.2 |
| Hardening Accelerator A | 0.3 | 0.3 | — | — |
| Hardening Accelerator B | — | — | 0.8 | 0.8 |
| Releasing agent A | 2.0 | 2.0 | 2.0 | — |
| Releasing agent B | — | — | — | 2.0 |
| Silane Coupling Agent A | — | — | — | — |
| Silane Coupling Agent B | — | — | — | — |
| Silane Coupling Agent C | — | — | — | — |
| Silane Coupling Agent D | — | — | — | — |
| Silane Coupling Agent E | — | 1.0 | — | — |

(Descriptions of the respective components shown in Tables 1 to 3)

Epoxy resin A: Bisphenol A type epoxy resin (epoxy equivalent=480)

Epoxy resin B: Triglycidyl isocyanurate

Epoxy resin C: Bisphenol A type epoxy resin (epoxy equivalent=650)

Epoxy resin D: Alicyclic epoxy resin having a structure represented by the following general formula (5):

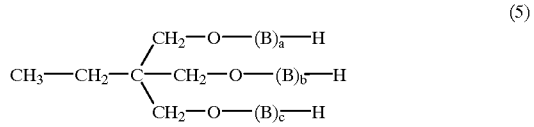

(5)

wherein B is the following cyclohexane skeleton; and a, b and c are integers satisfying a+b+c=15.

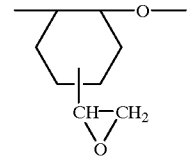

Hardener A: Hexahydrophthalic anhydride

Hardener B: Tetrahydrophthalic anhydride

Hardening accelerator A: 2-Ethyl-4-methylimidazole

Hardening accelerator B: 1,8-Diazabicyclo-(5,4,0)undecene-7

Releasing agent A: Polyoxyethylene pentacontanyl ether represented by the following general formula (6) (the weight ratio of the structure moiety represented by the general formula (2): 50%):

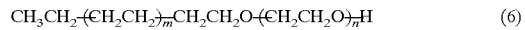

(6)

(m=25, n=15)

Releasing agent B: Polyoxyethylene pentacontanyl ether represented by the following general formula (7) (the weight ratio of the structure moiety represented by the general formula (2): 59%):

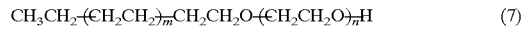

(7)

(m=25, n=22)

Silane coupling agent A: γ-Glycidoxypropyltrimethoxysilane

Silane coupling agent B: β-(3,4-Epoxycyclohexyl) ethyltrimethoxysilane
Silane coupling agent C: γ-Mercaptopropyltrimethoxysilane
Silane coupling agent D: γ-Aminopropyltriethoxysilane
Silane coupling agent E: Vinyltrimethoxysilane

TABLE 4

| | Example | | | | | |
|---|---|---|---|---|---|---|
| | 1 | 2 | 3 | 4 | 5 | 6 |
| Mold Releasing Property | A | A | A | A | A | A |
| Adhesion (kgf) | 5.3 | 4.8 | 3.2 | 5.6 | 2.3 | 5.2 |
| Light Transmittance (%) | 98.1 | 98.4 | 98.2 | 97.1 | 98.8 | 98.0 |
| Number of Faults 20 h in PCT (devices/devices) | 12/12 | 12/12 | 12/12 | 12/12 | 12/12 | 12/12 |
| 40 h | — | — | — | — | — | — |
| 60 h | — | — | — | — | — | — |
| 90 h | — | — | — | — | — | — |
| Number of Elements Separated (devices/devices) | 0/50 | 0/50 | 0/50 | 0/50 | 0/50 | 0/50 |

TABLE 5

| | Example | | | | |
|---|---|---|---|---|---|
| | 7 | 8 | 9 | 10 | 11 |
| Mold Releasing Property | A | A | A | A | A |
| Adhesion (kgf) | 5.5 | 4.8 | 3.2 | 4.8 | 5.3 |
| Light Transmittance (%) | 98.3 | 92.0 | 96.5 | 96.0 | 96.8 |
| Number of Faults 20 h in PCT (devices/devices) | 12/12 | 12/12 | 0/12 | 0/12 | 0/12 |
| 40 h | — | — | 0/12 | 0/12 | 0/12 |
| 60 h | — | — | 0/12 | 0/12 | 0/12 |
| 90 h | — | — | 0/12 | 0/12 | 0/12 |
| Number of Elements Separated (devices/devices) | 0/50 | 0/50 | 0/50 | 0/50 | 0/50 |

TABLE 6

| | Comparative Example | | | |
|---|---|---|---|---|
| | 1 | 2 | 3 | 4 |
| Mold Releasing Property | A | A | A | A |
| Adhesion (kgf) | 1.1 | 1.3 | 1.0 | 1.4 |
| Light Transmittance (%) | 98.3 | 98.1 | 92.0 | 96.4 |
| Number of Faults 20 h in PCT (devices/devices) | 12/12 | 12/12 | 12/12 | 12/12 |
| 40 h | — | — | — | — |
| 60 h | — | — | — | — |
| 90 h | — | — | — | — |
| Number of Elements Separated (devices/devices) | 28/50 | 14/50 | 25/50 | 13/50 |

As described above, the epoxy resin composition for encapsulating a photosemiconductor of the present invention comprises the releasing agent which has the structure moieties represented by the above-mentioned general formulas (1) and (2) in the molecule thereof, and in which the weight ratio of the structure moiety represented by general formula (2) is 25% to 95% by weight based on the whole molecule, and moreover, comprises the silane coupling agent having an epoxy, mercapto or amino group. Accordingly, the epoxy resin composition is excellent not only in releasing property from a mold in forming, for example, in transfer molding, and in transparency, but also in adhesion to the photosemiconductor element, which allows to provide the photosemiconductor device high in reliability.

While the invention has been described in detail and with reference to specific embodiments thereof, it will be apparent to one skilled in the art that various changes and modifications can be made therein without departing from the spirit and scope thereof.

What is claimed is:

1. An epoxy resin composition for encapsulating a photosemiconductor element comprising the following components (A) to (D):

(A) an epoxy resin;
   (B) a hardener;
   (C) a silane coupling agent having an epoxy group, a mercapto group or an amino group; and
   (D) a releasing agent in which a molecule thereof has structure moieties represented by the following general formulas (1) and (2), and in which the weight ratio of the structure moiety represented by general formula (2) is 25% to 95% by weight based on the whole molecule,

(1)

wherein m is a positive integer of 8 to 100 and

(2)

wherein n is a positive integer.

2. The epoxy resin composition according to claim 1, wherein the silane coupling agent having an epoxy group, a mercapto group or an amino group, component (C), is a compound represented by the following general formula (3):

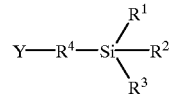

(3)

wherein Y is a monofunctional organic group having an epoxy group, a mercapto group or an amino group; $R^1$ to $R^3$ each independently represents a methoxy group, an ethoxy group, a methyl group or an ethyl group, with the proviso that at least one of $R^1$ to $R^3$ is a methoxy group or an ethoxy group; and $R^4$ is an alkylene group having 2 to 5 carbon atoms.

3. The epoxy resin composition according to claim 1 or 2, wherein the epoxy resin, component (A) include a resin represented by the following general formula (4):

(4)

wherein $R^6$ is an organic compound residue having y active hydrogen atoms; $n_1, n_2 \ldots n_y$ each represents an integer of 0 or 1 to 100, and the sum thereof is 1 to 100; y is an integer of 1 to 100; and A is the following cyclohexane skeleton having a substituent group Z:

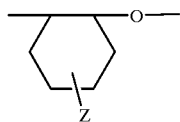

wherein Z is

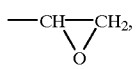

—CH=CH$_2$ or —CH(OH)—CH$_2$—OR$^7$, wherein R$^7$ is any one of hydrogen, an alkyl group, a carboalkyl group and a carboaryl group and contains at least one

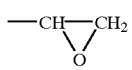

in the resin of general formula (4).

4. The epoxy resin composition according to claim 1, wherein the hardener, compound (B) is an acid anhydride.

5. A photosemiconductor device in which a photosemiconductor element is encapsulated with the epoxy resin composition comprising the following components (A) to (D):

(A) an epoxy resin;

(B) a hardener;

(C) a silane coupling agent having an epoxy group, a mercapto group or an amino group; and (D) a releasing agent in which a molecule thereof has structure moieties represented by the following general formulas (1) and (2), and in which the weight ratio of the structure moiety represented by general formula (2) is 25% to 95% by weight based on the whole molecule,

(1)

wherein m is a positive integer of 8 to 100 and

(2)

wherein n is a positive integer.

6. The photosemiconductor device according to claim 5, wherein the silane coupling agent having an epoxy group, a mercapto group or an amino group, component (C), is a compound represented by the following general formula (3):

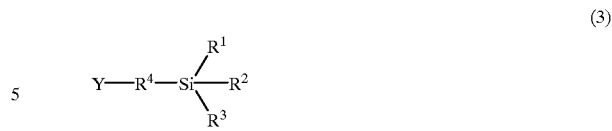

(3)

wherein Y is a monofunctional organic group having an epoxy group, a mercapto group or an amino group; R$^1$ to R$^3$ each independently represents a methoxy group, an ethoxy group, a methyl group or an ethyl group, with the proviso that at least one of R$^1$ to R$^3$ is a methoxy group or an ethoxy group; and R$^4$ is an alkylene group having 2 to 5 carbon atoms.

7. The photosemiconductor device according to claim 5, wherein the epoxy resin, component (A) include a resin represented by the following genera 1 formula (4):

(4)

wherein R$^6$ is an organic compound residue having y active hydrogen atoms; n$_1$, n$_2$ ... n$_y$ each represents an integer of 0 or 1 to 100, and the sum thereof is 1 to 100; y is an integer of 1 to 100; and A is the following cyclohexane skeleton having a substituent group Z:

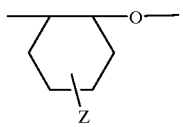

wherein Z is

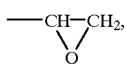

—CH=CH$_2$ or —CH(OH)—CH$_2$—OR$^7$, wherein R$^7$ is any one of hydrogen, an alkyl group, a carboalkyl group and a carboaryl group and contains at least one

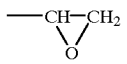

in the resin of general formula (4).

8. The The photosemiconductor device according to claim 5, wherein the hardener, compound (B) is an acid anhydride.

* * * * *